(12) United States Patent
Suzuki et al.

(10) Patent No.: US 6,900,694 B2
(45) Date of Patent: May 31, 2005

(54) HIGH FREQUENCY POWER AMPLIFIER MODULE AND WIRELESS COMMUNICATION APPARATUS

(75) Inventors: Masashi Suzuki, Komoro (JP); Hitoshi Akamine, Maebashi (JP); Tetsuaki Adachi, Tobu (JP); Takahiro Sato, Tamamura (JP); Masashi Maruyama, Komoro (JP); Susumu Takada, Saku (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/799,673

(22) Filed: Mar. 15, 2004

(65) Prior Publication Data

US 2004/0174219 A1 Sep. 9, 2004

Related U.S. Application Data

(63) Continuation of application No. 09/961,250, filed on Sep. 25, 2001, now Pat. No. 6,731,167.

(30) Foreign Application Priority Data

Sep. 29, 2000 (JP) ........................................ 2000-299153

(51) Int. Cl.[7] .................................................. H03G 5/16
(52) U.S. Cl. ...................................... 330/134; 330/133
(58) Field of Search ................................. 330/133, 134, 330/253, 255, 260, 261, 51, 126, 295, 296, 298, 285

(56) References Cited

U.S. PATENT DOCUMENTS

| | | | |
|---|---|---|---|
| 5,828,267 A | 10/1998 | Loeffler | |
| 5,903,854 A | * 5/1999 | Abe et al. | 455/575.1 |
| 5,973,557 A | 10/1999 | Miyaji et al. | |
| 6,025,753 A | 2/2000 | Landherr et al. | |
| 6,111,459 A | 8/2000 | Nishijima et al. | |
| 6,172,567 B1 | 1/2001 | Ueno et al. | |
| 6,297,694 B1 | 10/2001 | Yamamoto | |
| 6,329,879 B1 | * 12/2001 | Maruyama et al. | 330/289 |
| 6,492,872 B1 | * 12/2002 | Fujioka et al. | 330/285 |
| 6,605,999 B2 | 8/2003 | Matsushita et al. | |
| 6,636,114 B2 | * 10/2003 | Tsutsui et al. | 330/51 |

OTHER PUBLICATIONS

"NET's Special Feature", Nikkei Electronics, Jul. 26, 1999, No. 748, pp. 140–153.
"The PF08109B Dual–Band RF Power Module", GAIN, No. 131, published by Semiconductor Group of Hitachi, Ltd., Jan. 2000, pp. 3 and 29.

* cited by examiner

Primary Examiner—Jean Jeanglaude
Assistant Examiner—Linh V Nguyen
(74) Attorney, Agent, or Firm—Mattingly, Stanger, Malur & Brundidge, P.C.

(57) ABSTRACT

The number of components of a high frequency power amplifier is reduced. A bias resistance ratio is adjusted in accordance with a change in the threshold voltage Vth of a transistor. A high frequency power amplifier has a plurality of amplifying systems. Each of these systems has an input terminal to which a signal to be amplified is supplied, an output terminal, a bias terminal, a plurality of amplifying stages which are sequentially cascaded between the input and output terminals, and a bias circuit connected to the bias terminal and each of the amplifying stages to apply a bias potential to the amplifying stage. The amplifying stage includes a control terminal for receiving an input signal and the bias potential supplied to the stage and a first terminal for transmitting an output signal of the stage.

14 Claims, 15 Drawing Sheets

(a): R1/(R1 + R2 + (R3 - 1))
(b): R1/(R1 + R2 + (R3 - 1) + (R3 - 2))
(c): R1/(R1 + R2 + (R3 - 1) + (R3 - 3))
(d): NO BONDING
  R1/(R1 + R2 + (R3 - 1) + (R3 - 2) + (R3 - 3))

| V th | POSITION OF BALL BONDING |
|---|---|
| (1) ~ (2) | (a) |
| (3) ~ (4) | (b) |
| (5) ~ (6) | (c) |
| (7) ~ (8) | (d) |

HIGH ↕ LOW

HIGH FREQUENCY POWER AMPLIFIER MODULE AND WIRELESS COMMUNICATION APPARATUS

This is a continuation application of U.S. Ser. No. 09/961,250, filed Sep. 25, 2001 is now a U.S. Pat. No. 6,731,167.

BACKGROUND OF THE INVENTION

1. Field of the Invention

The present invention relates to a high frequency power amplifier having a plurality of amplifying systems and a wireless communication apparatus including the high frequency power amplifier, and particularly relates to a technology usefully applicable to a multi-band communication type of cellular phone which has multiple communication functions of different communication frequencies.

2. Prior Art

In North American cellular phone market, so-called dual mode cellular phones have recently been spreading which are cellular phones incorporating conventional analog AMPS (advanced mobile phone services) that cover the whole of the North America and digital services such as TDMA (time division multiple access) and CDMA (code division multiple access).

In other regions including Europe, GSM (Global system for mobile communication and DCS (digital cellular system) utilizing TDMA techniques and FDD (frequency division duplex) techniques are used.

In "Nikkei Electronics" pp. 140–153 published by Nikkei BP Corp. on Jul. 26, 1999 [No. 748], a dual mode cellular phone was disclosed in which a GSM having an operating frequency of 800 to 900 MHz and a DCS having an operating frequency of 1.7 to 1.8 GHz are integrated. The same article disclosed a multi-layer ceramics device in which passive components are integrated to make the circuit as a whole compact.

Further, a dual band RF power module was disclosed in "GAIN" No. 131, January 2000 published by Semiconductor Group of Hitachi, Ltd.

SUMMARY OF THE INVENTION

There is a trend toward cellular phones with increased functions to allow advanced information communication. High frequency power amplifiers (high frequency power amplifier modules) incorporated in cellular phones have more functions to satisfy such a need. Especially, high frequency power amplifiers having a plurality of communication modes (and communication bands) are assembled from a greater number of components compared to single communication mode products, which increases the size and cost of such devices.

Under such circumstances, the inventors studied the possibility of a reduction in the number of chip resistors incorporated in a high frequency power amplifier in order to provide the amplifier with smaller outline dimensions.

FIG. 23 is a circuit diagram showing the relationship between an equivalent circuit of a conventional dual band type high frequency power amplifier module incorporating a GSM and a DCS and semiconductor chips and the like. The high frequency power amplifier module has an amplifying system e for GSM as a first amplifying system and an amplifying system f for DCS as a second amplifying system.

The GSM amplifying system e has a three-stage consisting configuration (consisting of a first amplifying stage, a second amplifying stage, and a third amplifying stage (final amplifying stage)) in which transistors Q1, Q2, and Q3 are sequentially cascaded between an input terminal Pin-GSM and an output terminal Pout-GSM.

Each of the transistors Q1, Q2 and Q3 is constituted by a MOSFET (metal oxide semiconductor field-effect-transistors) and is applied with a signal and a bias potential at its gate electrode which is a control terminal. The bias potential is applied to a bias terminal Vapc-GSM (or automatic power control terminal), and a predetermined bias potential is applied to the respective control terminal through bias resistors R1 through R5.

A power supply potential Vdd-GSM is applied to a first terminal (drain terminal) of each of the transistors Q1, Q2, and Q3, and an amplification signal is output to the first terminal. A reference potential (ground potential) is supplied to a second terminal (source electrode) of the transistors. L1 through L7 represent a matching circuit.

The DCS amplifying system f has the same configuration as that of the above-described GSM amplifying system e. Specifically, it has a three-stage configuration (consisting of a first amplifying stage, a second amplifying stage, and a third amplifying stage (final amplifying stage)) in which transistors Q4, Q5, and Q6 are sequentially cascaded between an input terminal Pin-DCS and an out put terminal Pout-DCS.

Each of the transistors Q4, Q5 and Q6 is constituted by a MOSFET and is applied with a signal and a bias potential at its gate electrode which is a control terminal. The bias potential is applied to a bias terminal Vapc-DCS, and a predetermined bias potential is applied to the respective control terminal through bias resistors R6 through R10.

A power supply potential Vdd-DCS is applied to a first terminal (drain terminal) of each of the transistors Q4, Q5, and Q6, and an amplification signal is output to the first terminal. A reference potential (ground potential) is supplied to a second terminal (source electrode) of the transistors. L8 through L14 represent a matching circuit.

The transistors Q1 and Q2 of the GSM amplifying system e and DCS amplifying system f have a monolithic configuration in that they are incorporated in a single semiconductor chip. In such a configuration, however, bias resistors are externally mounted, which hinders reduction of the size of high frequency power amplifiers. Further, while the first and second amplifying stages of both the GSM amplifying system e and DCS amplifying system f are integrated in one semiconductor chip, two semiconductor chips are required because there are two amplifying systems, which also hinders reduction of the size of high frequency power amplifiers.

Referring to the transistors that constitute the amplifying stage, since the threshold voltage Vth of the transistors is slightly inconsistent (varies) between production lots, the bias resistance ratios of the resistors that form a bias circuit must be changed from lot to lot. This method makes manufacturing operations complicated because chip resistors must be selected for use in each production lot.

It is an object of the invention to provide a compact high frequency power amplifier and a wireless communication apparatus incorporating the same high frequency power amplifier.

It is another object of the invention to provide a technique for allowing a bias resistance ratio to be easily adjusted in accordance with a change in a threshold voltage Vth of a transistor.

The above and other objects and novel features of the invention will become apparent from the description of the present specification and the accompanying drawings.

Briefly, primary aspects of the invention disclosed in this specification are as follows.

(1) There is provided a high frequency power amplifier having a plurality of amplifying systems, characterized in that each of the amplifying systems comprises:

an input terminal to which a signal to be amplified is supplied;

an output terminal;

a bias terminal;

a plurality of amplifying stages which are sequentially cascaded between the input terminal and output terminal; and a bias circuit connected to the bias terminal and each of the amplifying stages to apply a bias potential to the amplifying stage, in that each of the amplifying stages includes a control terminal for receiving an input signal and the bias potential supplied to the stage and a first terminal for transmitting an output signal of the stage, and in that a first amplifying stage and a second amplifying stage of each of the amplifying systems are monolithically formed on a single semiconductor chip, and a part of bias resistors that constitute bias circuits of the first amplifying stage and second amplifying stage are monolithically formed on the semiconductor chip.

Referring to the terminals of the first amplifying stage and second amplifying stage provided on a surface of the semiconductor chip, the control terminals and the first terminals are alternately provided in the same direction.

A wire that is connected to the control terminal of the second amplifying stage provided on the surface of the semiconductor chip and a wire connected to the first terminal of the second amplifying stage extend in directions orthogonal to each other or in directions crossing each other.

The bias resistance ratio of the first amplifying stage of each of the amplifying systems or the bias resistance ratios of the first amplifying stage and second amplifying stage can be adjusted. Specifically, the bias resistance ratio of the first amplifying stage or the bias resistance ratios of the first amplifying stage and second amplifying stage are adjusted by selecting connecting positions of electrical connectors that connect the plurality of bias resistors formed on the surface of the semiconductor chip, the choice including no connection with the electrical connectors.

Such a high frequency power amplifier is incorporated in a wireless communication apparatus to allow dual band communication.

With the means as described in the above (1), (a) since the first amplifying stage and second amplifying stage of each amplifying system are monolithically formed on a single semiconductor chip, a compact size can be achieve compared to a structure in which they are incorporated in separate semiconductor chips. Since a part of bias resistors that constitute bias circuits for the first amplifying stage and second amplifying stage are monolithically formed on the semiconductor chip, the high frequency power amplifier can be made compact compared to a structure in which chip resistors are separately mounted.

(b) The size and manufacturing cost of the high frequency power amplifier can be reduced through a reduction in the number of components that is achieved by monolithically forming the first amplifying stage and second amplifying stage of each amplifying system on a single semiconductor chip and by monolithically forming a part of bias resistors that constitute bias circuits for the first amplifying stage and second amplifying stage on the semiconductor chip as described in the above (1).

(c) Referring to the terminals of the first amplifying stage and second amplifying stage provided on a surface of the semiconductor chip, control terminals (e.g., gate electrodes) and first terminals (e.g., drain electrodes) are alternately provided in the same direction. Therefore, the direction of extracting the output of the first amplifying stage (the extending direction of the wire) and the direction of extracting the output of the second amplifying stage (the extending direction of the wire) are not close and adjacent to each other, which makes it possible to prevent any reduction in the gain and isolation attributable to a mutual induction effect between the wires.

(d) Since the input wire connected to the control terminal of the second amplifying stage provided on the surface of the semiconductor chip and the output wire connected to the first terminal of the second amplifying stage extend in directions orthogonal to each other or in directions crossing each other, it is possible to suppress crosstalk between them.

(e) A predetermined bias resistance ratio can be achieved by setting a bonding program for the threshold voltage Vth of each transistor and by connecting predetermined bias resistors with the electrical connectors (bonding wires) based on the set program (there is an alternative of providing no connection with the electrical connectors). The resistance of a bias resistor constituted by a conductive layer formed on a semiconductor chip can be defined with accuracy of 5% or less. It is therefore possible to set an optimum bias potential for each transistor to stabilize the operating point of the transistor. As a result, variations of a power control curve (Vapc-Pout) can be reduced to provide improved characteristics.

(f) A wireless communication apparatus incorporating a high frequency power amplifier having the advantages described in the above (a) through (e) is capable of high performance dual band communication and can be provided at a low cost with a compact size.

BRIEF DESCRIPTION OF THE DRAWINGS

FIG. 23 is a circuit diagram showing the relationship between an equivalent circuit of a conventional dual band type high frequency power amplifier module incorporating a GSM and a DCS and semiconductor chips and the like.

DETAILED DESCRIPTION OF PREFERRED EMBODIMENTS

Preferred embodiments of the invention will now be described in detail with reference to the accompanying drawings. Throughout the drawings for illustrating preferred embodiments of the invention, parts having like functions are indicated by like reference numbers and repetition will be avoided in describing them.

[First Embodiment]

The first embodiment will refer to a high frequency power amplifier having an amplifying system for GSM and an amplifying system for DCS and to an example of an application of the invention to a wireless communication apparatus incorporating such a high frequency power amplifier.

Figure 3:
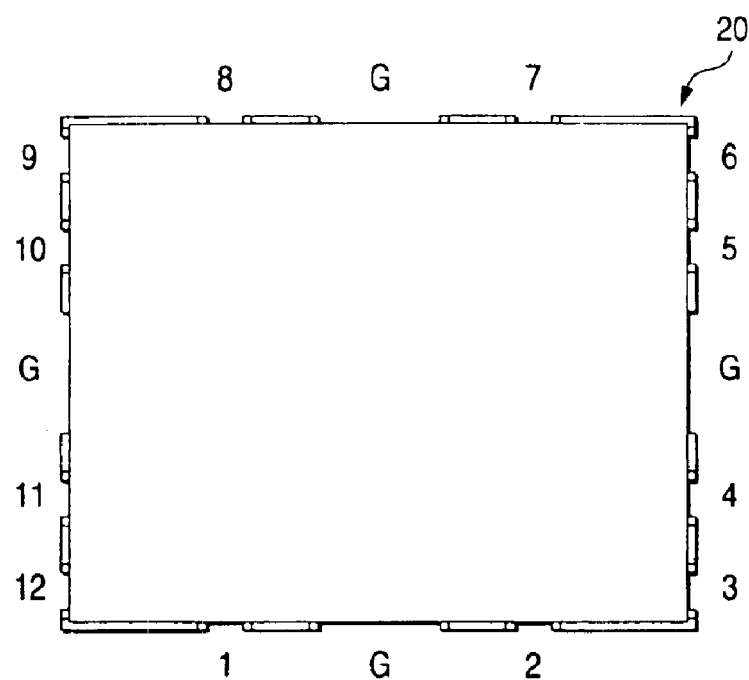
FIG. 3 is a plan view of the high frequency power amplifier of the first embodiment.
Figure 4:
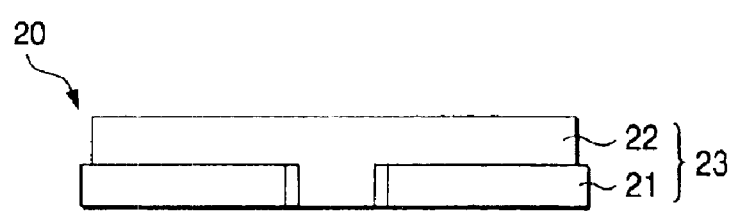
FIG. 4 is a side view of the high frequency power amplifier of the first embodiment.
Figure 5:
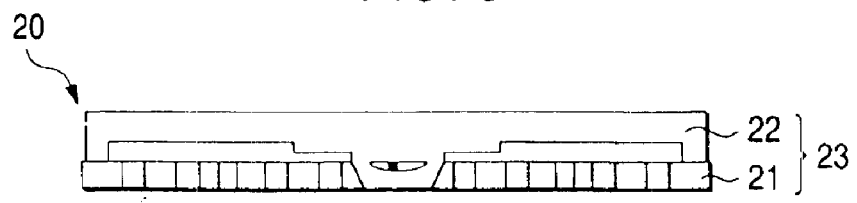
FIG. 5 is a front view of the high frequency power amplifier of the first embodiment.
Figure 6:
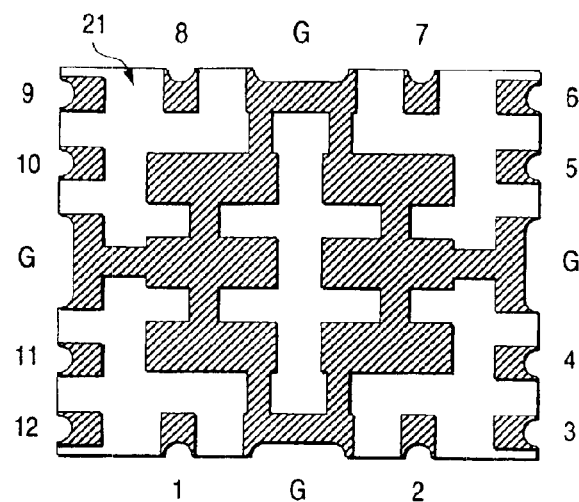
FIG. 6 is a schematic perspective plan view showing a pattern of electrodes on a bottom surface of the high frequency power amplifier of the first embodiment.

As shown in the plan view in FIG. 3, the side view in FIG. 4, and the front view in FIG. 5, a high frequency power amplifier (high frequency power amplifier module) 20 has a flat rectangular structure in its external appearance. FIG. 6 is a schematic perspective plan view showing a pattern of electrodes on a bottom surface of the high frequency power amplifier.

The high frequency power amplifier 20 is constructed in the form of a package 23 with a flat rectangular structure consisting of a module substrate 21 constituted by a plate-like wiring substrate and a cap 22 mounted on one surface (principal surface) of the module substrate 21 in an overlapping relationship. The cap 22 is made of a metal which provides an electromagnetic shielding effect. A circuit as shown in FIG. 7 is formed by a wiring pattern on the module substrate 21 and semiconductor amplification devices loaded on the module substrate 21.

As shown in FIG. 3 and FIG. 6, external electrode terminals are provided across a circumferential surface and a bottom surface of the high frequency power amplifier 20. The external electrode terminals are surface mount type terminals which are formed by wirings formed on the module substrate 21 and solder provided on the surface of the wirings. Reference numerals 1, 2, 7, and 8 represent non-contact terminals N/C; reference numeral 3 represents a terminal for Pout-DCS; reference numeral 4 represents a terminal for Vdd-DCS; reference numeral 5 represents a terminal for Vdd-GSM; reference numeral 6 represents a terminal for Pout-GSM; reference numeral 9 represents a terminal for Pin-GSM; reference numeral 10 represents a terminal for Vapc-GSM; reference numeral 11 represents a terminal for Vapc-DCS; reference numeral 12 represents a terminal for Pin-DCS; and reference symbol G represents a ground terminal.

Figure 7:
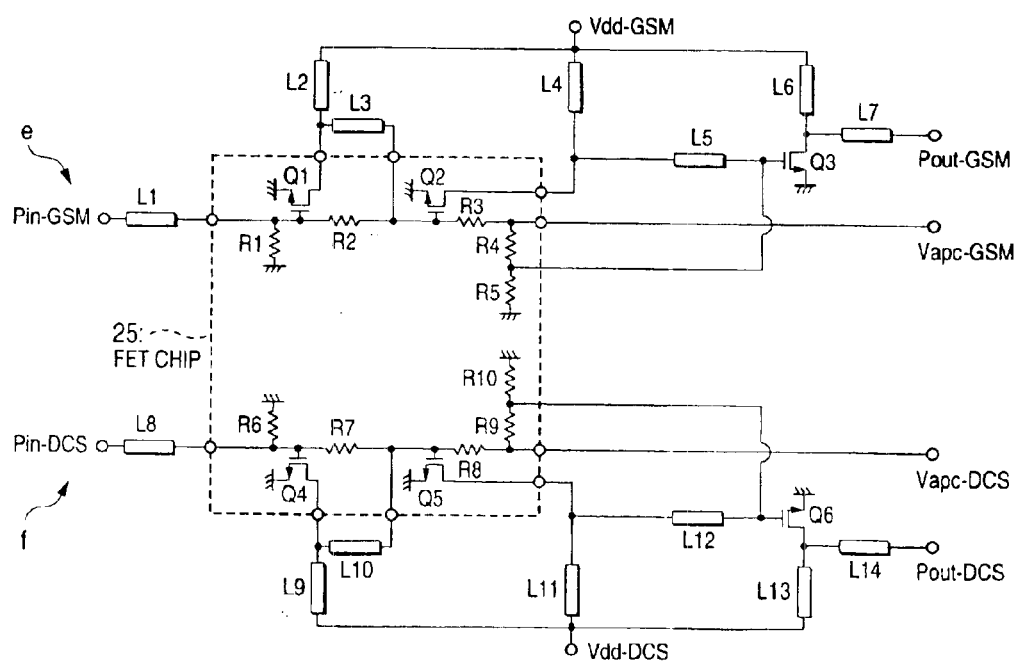
FIG. 7 is an equivalent circuit diagram of the high frequency power amplifier of the first embodiment.

As shown in FIG. 7, the high frequency power amplifier has an amplifying system e for GSM and an amplifying system f for DCS. The amplifying systems e and f have the same circuit configuration, although there are differences in performance between some electronic components used in those systems. Therefore, when describing the amplifying system e, the reference numbers of components in the amplifying system f corresponding to those in the amplifying system e are shown in brackets to indicate that the description also applies to the amplifying system f.

The external electrode terminals of the amplifying system e are Pin-GSM (Pin-DCS in the amplifying system f) as an input terminal, Pout-GSM (Pout-DCS in the amplifying system f) as an output terminal, Vdd-GSM (Vdd-DCS in the amplifying system f) as a first reference potential (power supply potential), and Vapc-GSM (Vapc-DCS in the amplifying system f) as a bias terminal. A ground terminal is provided as a second reference potential.

Three amplifying stages are cascaded between the terminals Pin-GSM (Pin-DCS) and Pout-GSM (Pout-DCS). The first, second, and third amplifying stages are constituted by transistors Q1, Q2, and Q3 (Q4, Q5, and Q6), respectively.

Each of the transistors serving as an amplifying stage is comprised of a control terminal (gate electrode) for receiving an input signal and a bias potential supplied to the stage, a first terminal (drain electrode) for transmitting an output signal from the stage, and a second terminal (source electrode) for receiving a reference potential (ground potential) for the stage.

The terminal Pin-GSM (Pin-DCS) is connected to the gate electrode of the transistor Q1 (Q4) through a matching circuit L1 (L8). Since the amplifying system has a three-stage configuration, the gate electrodes of the transistors of the second and third stages are both connected to the drain electrodes of the transistor of the preceding stages through matching circuits L3 (L10) and L5 (L12). The drain electrode of the transistor Q3 (Q6) that is an output stage or a final amplifying stage is connected to the terminal Pout-GSM (Pout-DCS) through a matching circuit L7 (L14).

The drain electrodes of the transistors Q1, Q2, and Q3 are connected to the terminal Vdd-GSM (Vdd-DCS) through matching circuits L2, L4, and L6 (L9, L11, and L13).

The gate electrodes of the transistors Q1, Q2, and Q3 are connected to the terminal vapc-GSM (Vapc-DCS). Bias circuits are provided between the gate electrodes and the terminal Vapc-GSM (Vapc-DCS) to control bias potentials to be applied to the respective gate electrodes. The bias circuits are constituted by bias resistors R1 through R5 (R6 through R10) that provide voltage dividing resistance.

The part indicated by the box in a broken line in FIG. 7 is a semiconductor chip (FET chip) 25. The semiconductor chip 25 monolithically incorporates the transistors Q1 and Q2 of the amplifying system e for GSM, the bias resistors R1, R2, R3, R4, and R5 that determine bias resistance ratios for the transistors Q1 and Q2, the transistors Q4 and Q5 of the amplifying system f for DCS, and the bias resistors R6, R7, R8, R9, and R10 that determine bias resistance ratios for the transistors Q4 and Q5. This makes it possible to reduce the number of components, thereby allowing a reduction in the size and manufacturing cost of the high frequency power amplifier.

Figure 1:
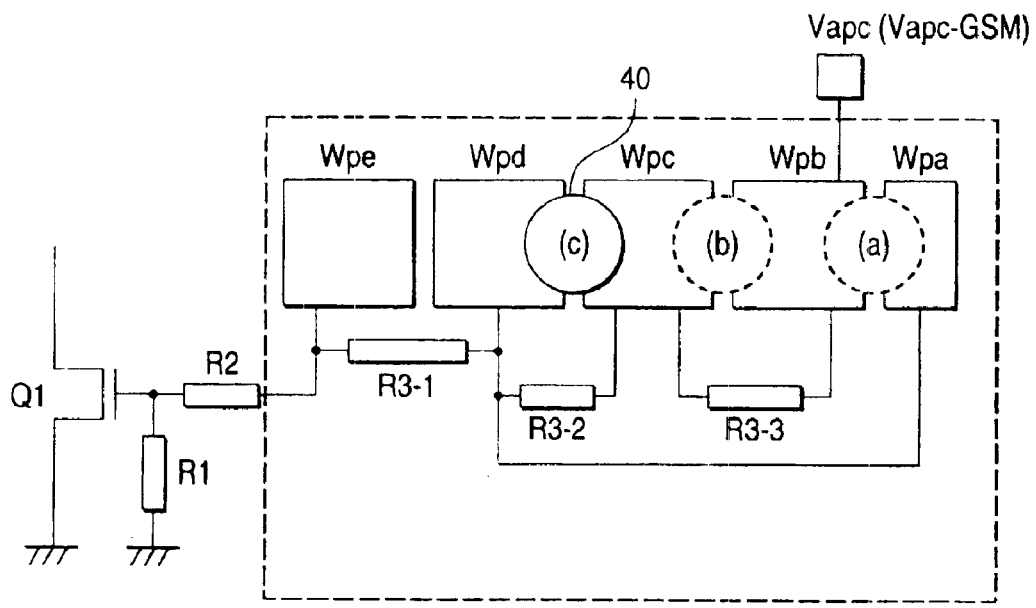
FIG. 1 is a schematic diagram showing a method of adjusting bias resistance ratios in accordance with a threshold voltage Vth of a transistor in a high frequency power amplifier which is an embodiment (first embodiment) of the invention.

One of the features of the invention is that the first embodiment has a configuration in which the bias resistance ratios can be changed during assembly in accordance with variations of threshold voltages vth of the transistors. Specifically, FIG. 1 is a schematic diagram showing an example of an application of the invention to the region the bias circuit of the transistor Q1. The part enclosed in the box in a dotted line is a bias resistance ratio correcting section. In the bias resistance ratio correcting section, five bonding portions Wpa, Wpb, Wpc, Wpd, and Wpe are provided in series in a state in which they are electrically isolated from each other. The bonding portions are constituted by a conductive layer and are formed on a surface of the semiconductor chip 25. The bonding portions Wpa, Wpb, Wpc, and Wpd are in a programmable configuration in which only adjoining bonding portions can be electrically connected by securing an electrical connector 40 constituted by a conductor between the adjoining bonding portions. In FIG. 1, connecting positions are indicated by (a), (b), and (c). In FIG. 1, for example, an electrical connector 40 is secured at the connecting position (a) (see FIG. 2) to electrically connect the bonding portions Wpc and Wpd. Resistive elements R3-1, R3-2, and R3-3 are provided on a side of the bonding portions Wpa, Wpb, Wpc, Wpd, and Wpe.

The bonding portions Wpa, Wpb, Wpc, Wpd, and Wpe and the resistive elements R3-1, R3-2, and R3-3 are connected as described below through wirings to which no reference symbol is assigned. The terminal Vapc (Vapc-GSM) is connected to the bonding portion Wpb through a wire, and the bonding portion Wpe is connected to the bias resistor R2 through a wire. One end of the resistive element R3-3 is connected to the bonding portion Wpb through a wire, and the other end of the same is connected to the bonding portion Wpc through a wire. One end of the resistive element R3-2 is connected to the bonding portion Wpc through a wire, and the other end of the same is connected to the bonding portion Wpd through a wire. The bonding portion Wpa and the bonding portion Wpd are connected through a separate wire. One end of the resistive element R3-1 is connected to the bonding portion Wpd through a wire, and the other end of the same is connected to the bonding portion Wpe through a wire.

Therefore, the adjustment of the bias resistance ratio can be carried out in four modes (a) through (d) as shown in FIG. 1. Referring to FIG. 1, in a connection mode (a), the electrical connector is secured to a connecting position (a)., which results in a bias resistance ratio of R1/[R1+R2+(R3-1)]. In a connection mode (b), the electrical connector is secured to a connecting position (b), which results in a bias resistance ratio of R1/[R1+R2+(R3-1)+(R3-2)]. In a connection mode (c), the electrical connector is secured to a connecting position (c), which results in a bias resistance ratio of R1/[R1+R2+(R3-1)+(R3-3)]. In a connection mode (d), the electrical connector is not bonded, which results in a bias resistance ratio of R1/[R1+R2+(R3-1)+(R3-2)+(R3-3)].

Figure 8:
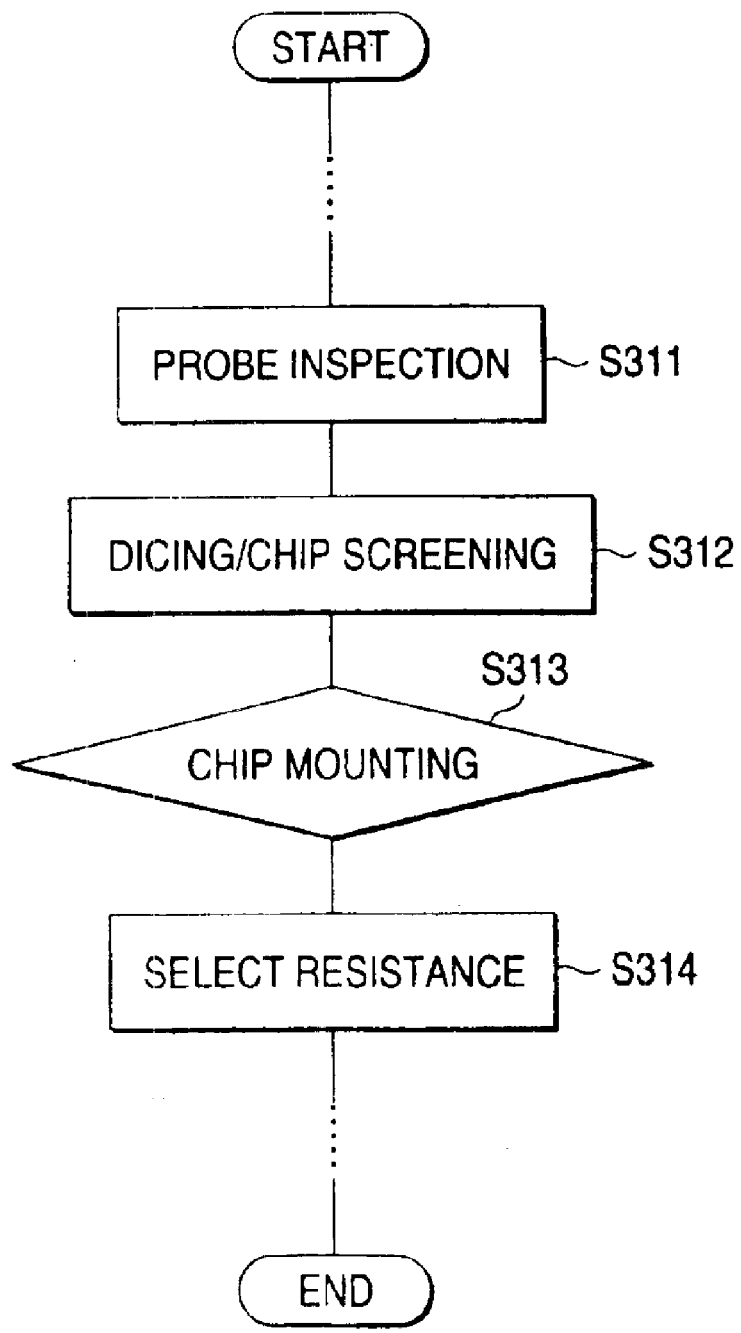
FIG. 8 is a flow chart showing a part of the fabrication of the high frequency power amplifier of the first embodiment.

The connection of the electrical connector 40 will now be described. FIG. 8 is a flow chart showing processing steps (S) of a part of the fabrication of a high frequency power amplifier, i.e., a flow chart showing steps starting from a probe inspection (S311) that is followed by dicing/chip screening (S312), chip mounting (S313), and selection of resistors (S314).

After forming semiconductor devices in longitudinal and lateral directions on a surface of a semiconductor substrate which is not shown, the characteristics of the semiconductor devices are inspected (probe inspection); the semiconductor substrate is then cut in the longitudinal and lateral directions (dicing); and only semiconductor devices (semiconductor chips) judged to be good at the probe inspection are used.

Figures 11, 12:
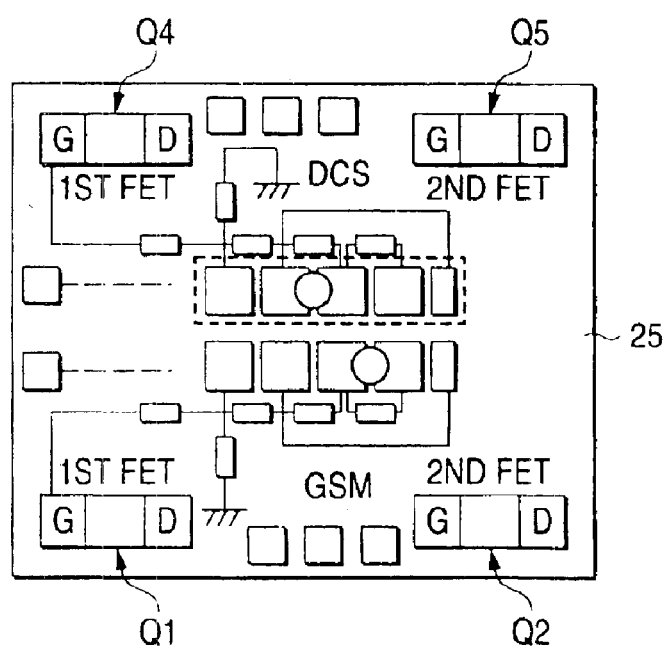
FIG. 11 is a table for selection of modes of ball bonding for adjusting a bias resistance ratio of a transistor incorporated in the high frequency power amplifier of the first embodiment.
FIG. 12 is a schematic plan view of semiconductor chips on which the above-described adjustment of a bias resistance ratio has been completed.

Next, the semiconductor chips are mounted to predetermined positions of the above-described module substrate 21, and positions to secure the electrical connectors 40 are selected in accordance with the threshold voltages Vth of the transistors of the semiconductor chips. In this example, as shown in FIG. 12, the bias resistance ratios of the transistor Q1 of the GSM amplifying system e and the transistor Q4 of the DCS amplifying system f can be adjusted.

Figure 2:
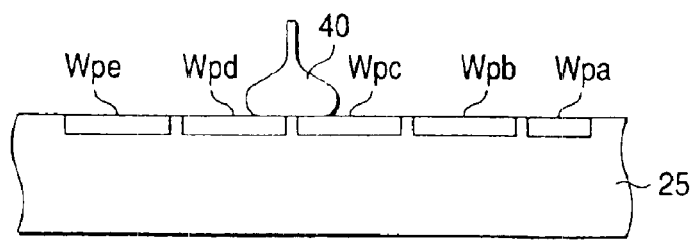
FIG. 2 is a schematic sectional view of a part of a semiconductor chip on which the above-described adjustment of bias resistance ratios has been completed.
Figure 10:
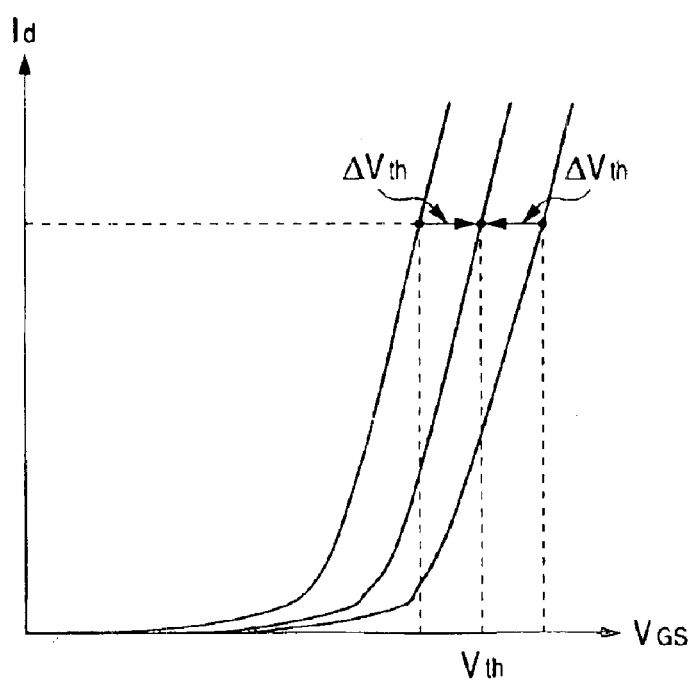
FIG. 10 is a graph showing current-voltage characteristics of a transistor.

As shown in the graph in FIG. 10, slight deviations (ΔVth) of the threshold voltage Vth of transistors occur between production lots. In order to solve this, as shown in FIG. 11, four modes of connection are employed depending on values of the threshold voltage Vth to obtain a predetermined bias resistance ratio. Specifically, when the threshold voltage Vth is a value within ranges (1) and (2), the position (a) shown in FIG. 1 is selected as the connection position. Similarly, the position (b) shown in FIG. 1 is selected as the connecting position when the threshold voltage Vth is within ranges (3) and (4), and the position (c) shown in FIG. 1 is selected as the connecting position when the threshold voltage Vth is within ranges (5) and (6). The electrical connector is connected to nowhere when the threshold voltage vth is within ranges (7) and (8) as shown in the mode (d). Although no specific value is shown for the ranges (1), (2), and so on, an appropriate value may be selected for each range. FIG. 2 shows a state in which the electrical connector 40 is connected to the position (a). The electrical connector 40 is provided by cutting a wire in the vicinity of a ball portion of the same after nail head bonding.

The bias resistance ratio can be corrected by selecting the position of the electrical connector appropriately or making no connection, which makes it possible to compensate the threshold voltage Vth of the transistors Q1 and Q4 for any variation. The adjustment of the bias resistance ratio may be performed on the transistor of the second amplifying stage, although not performed on the final amplifying stage.

Figure 9:
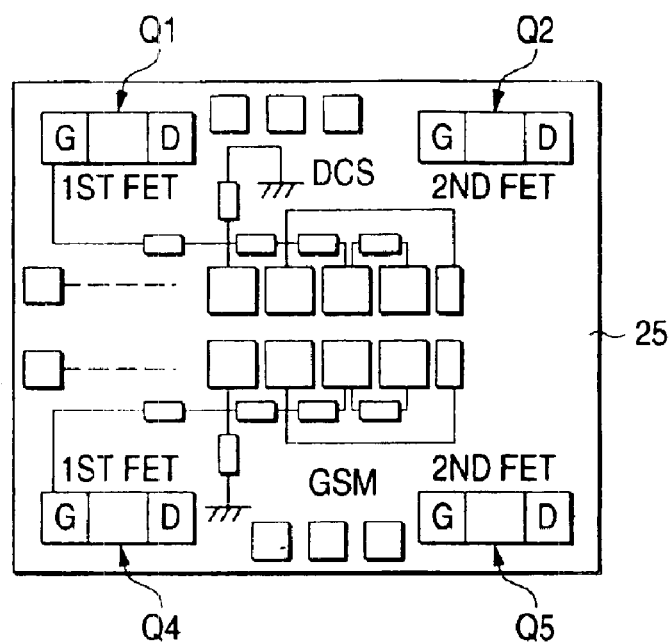
FIG. 9 is a schematic plan view of semiconductor chips incorporated in the high frequency power amplifier of the first embodiment.

FIG. 9 is a plan view schematically showing the semiconductor chip 25. Similarly to FIG. 12, FIG. 9 shows the gate electrodes (G) and drain electrodes (D) of the first stage transistors (first FETS) and second stage transistors (second FETS) for GSM and DCS. FIG. 9 omits some parts of the chip to avoid complicatedness, and no reference numeral is shown for each part of a bias resistance ratio correcting section.

It is one of the features of the invention that the gate electrodes (G) and drain electrodes (D) of the first FETS and second FETs are laid out such that they are alternately provided in the same direction. In such a layout, the direction of extracting the output of the first FETs (first amplifying stage) or the direction in which wires extend therefrom is not close and adjacent to the direction of extracting the output of the second FETs (second amplifying stage) or the direction in which wires extend therefrom (see FIG. 13), which makes it possible to present any reduction in gain and isolation attributable to a mutual induction effect between the wires. That is, any reduction in isolation can be suppressed, and any reduction in gain attributable to a mutual induction effect between the wires can be prevented.

Figure 13:
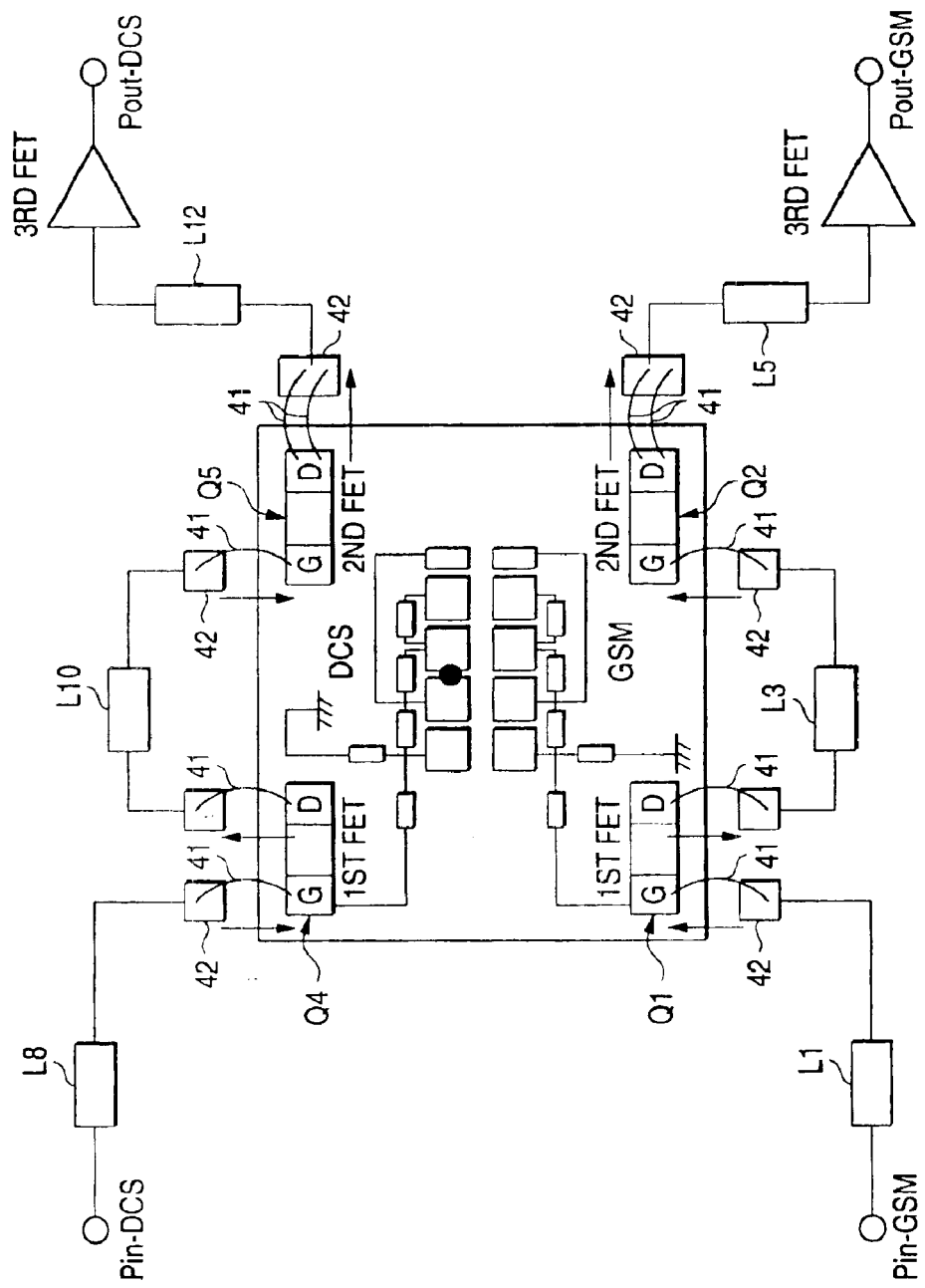
FIG. 13 is a plan view showing wirings provided between electrodes of the semiconductor chips incorporated in the high frequency power amplifier of the first embodiment and wire bonding pads.
Figure 14A:
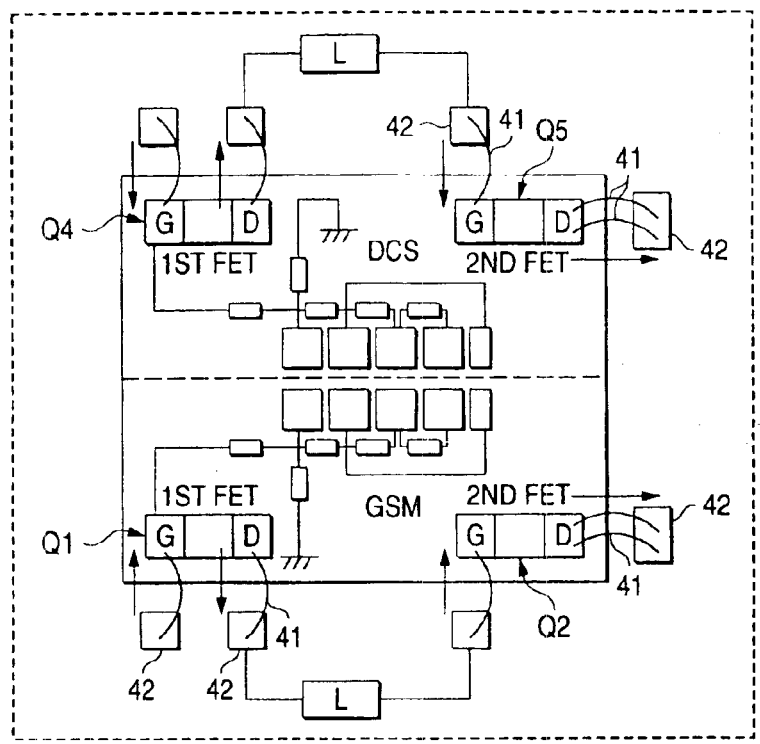
FIGS. 14A and 14B are plan views showing wirings provided between electrodes of the semiconductor chips incorporated in the high frequency power amplifier of the first embodiment and wire bonding pads and other wirings.

It is another feature of the invention that wires 41 connected to the gate electrodes of the second FET (Q2) of the GMS amplifying system and the second FET (Q5) of the DCS amplifying system extend in an orthogonal relationship with wires 41 connected to the drain electrodes of the same, as shown in FIG. 13 and FIG. 14A. This makes it possible to prevent crosstalk between input power and output power. Crosstalk can be prevented by setting the wires in a crossed state that is similar to an orthogonal relationship instead of setting them in an orthogonal relationship. Other ends of the wires 41 are connected to wire bonding pads 42 provided in a part of the wiring.

As shown in FIG. 9, the transistor (first FET) Q1 of the first amplifying stage and the transistor (second FET) Q2 of the second amplifying stage of the semiconductor chip in the first embodiment are provided in the same direction. This suppresses variation of electrical characteristics (Vth versus drain current characteristics). Specifically, when the source-drain directions of the first and second FETs in which current flows are orthogonal to each other, the crystal axis of the semiconductor substrate is changed by 90 deg., which increases the possibility of variation of characteristics during a heat treatment.

Figure 14B:
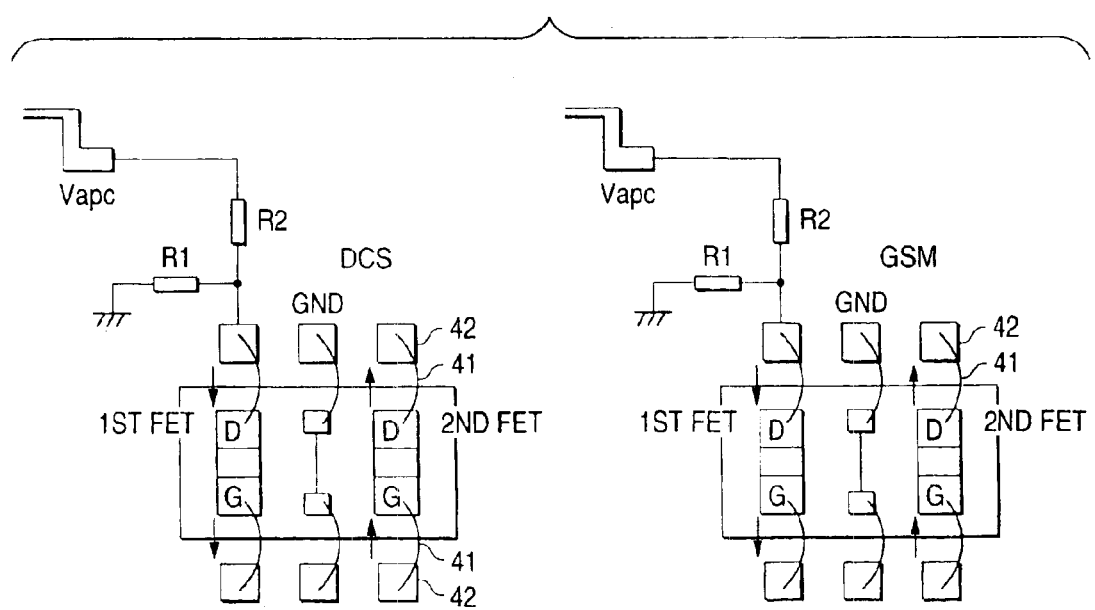

As shown in FIG. 14B, when the first and second FETs for GSM are incorporated in a single semiconductor chip and the first and second FETs for DCS are incorporated in a single semiconductor chip, a configuration may be employed in which ground wiring is provided between the first and second FETs to prevent any reduction in the gain attributable to a mutual induction effect between the wires. However, such a configuration can not be used as it is in the present embodiment in which the two amplifying systems are incorporated in a single semiconductor chip. Therefore, the present embodiment has the configuration shown in FIG. 14A.

Figure 15:
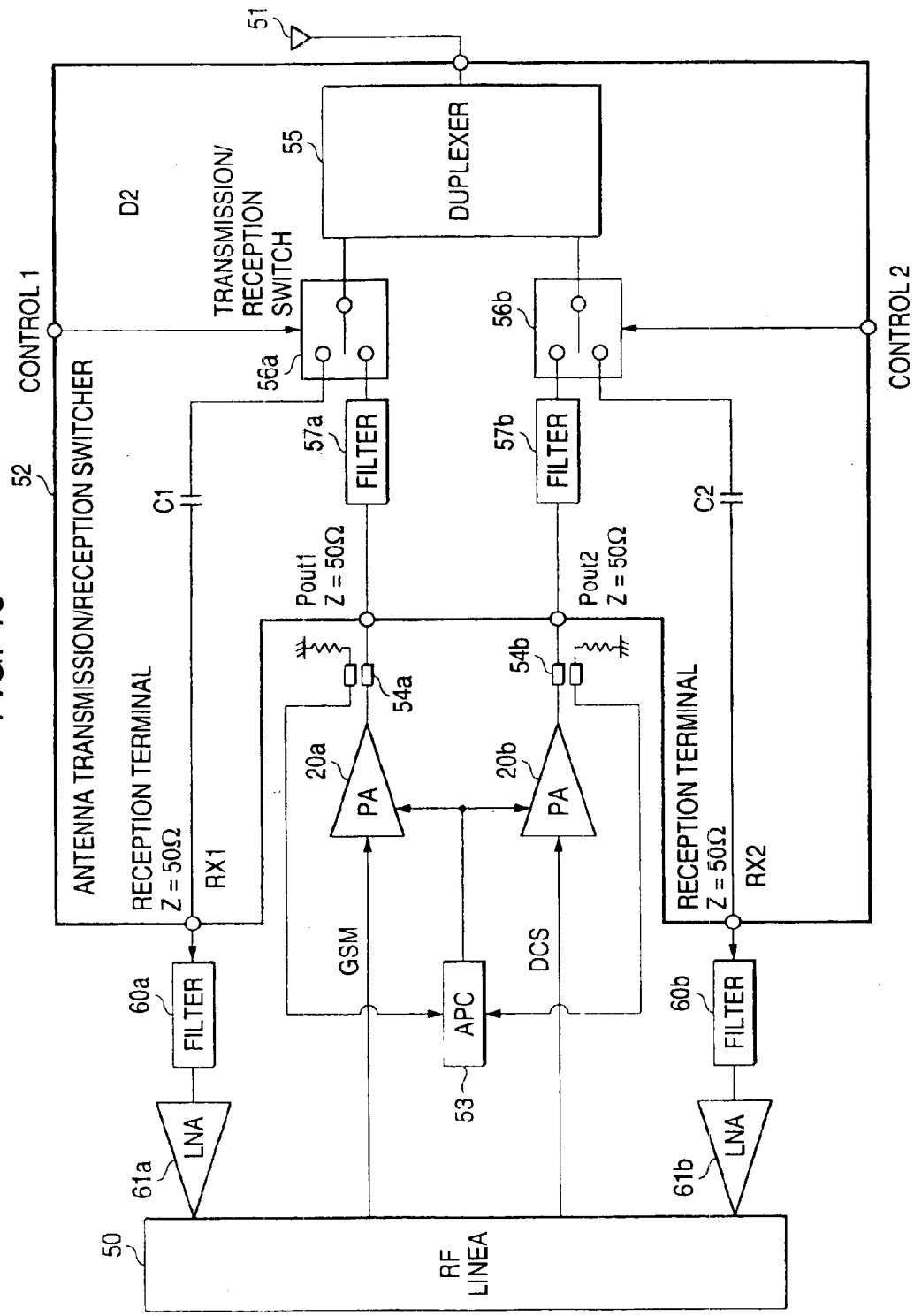
FIG. 15 is a block diagram of a part of a wireless communication apparatus incorporating the high frequency power amplifier of the first embodiment showing a functional configuration of the same.

As shown in FIG. 15, such a high frequency power amplifier is used by incorporating the same in a wireless communication apparatus. FIG. 15 is a block diagram of a part of a dual band wireless communication apparatus showing a part of the same ranging from a high frequency signal processing IC (RF linear) 50 to an antenna 51. FIG. 15 shows two separate amplifiers as the amplifying system of the high frequency power amplifier, i.e., an amplifying system for GSM and an amplifying system for DCS, the amplifiers being represented by PA (power amplifier) 20a and 20b.

The antenna 51 is connected to an antenna terminal Antenna of an antenna transmission/reception switch 52. The antenna transmission/reception switch 52 has terminals Pout 1 and Pout 2 to which the output of the amplifiers PA 20a and 20b is input, reception terminals RX1 and RX2, and control terminals control 1 and control 2.

A GSM signal from the high frequency signal processing IC 50 is transmitted to the amplifier PA 20a and output to the terminal Pout 1. The output of the amplifier PA 20a is detected by a coupler 54a, and the detection signal is fed back to an automatic power control circuit (APC circuit) 53. The APC circuit 53 operates based on the detection signal to control the amplifier PA 20a.

Similarly, a DCS signal from the high frequency signal processing IC 50 is transmitted to the amplifier PA 20b and output to the terminal Pout 2. The output of the amplifier PA 20b is detected by a coupler 54b, and the detection signal is fed back to the APC circuit 53. The APC circuit 53 operates based on the detection signal to control the amplifier PA 20b.

The antenna transmission/reception switch 52 has a duplexer 55. The duplexer 55 has three terminals. One of the terminals is connected to the antenna terminal Antenna. One of the remaining two terminals is connected to a transmission/reception select switch 56a for GSM, and the other is connected to a transmission/reception select switch 56b for DCS.

An a-contact of the transmission/reception select switch 56a is connected to the terminal Pout 1 through a filter 57a. A b-contact of the transmission/reception select switch 56a is connected to the reception terminal RX1 through a capacity C1. At the transmission/reception select switch 56a, switching is performed based on a control signal input to the control terminal control 1 to establish electrical connection to the a-contact or b-contact.

An a-contact of the transmission/reception select switch 56b is connected to the terminal Pout 2 through a filter 57b. A b-contact of the transmission/reception select switch 56b is connected to the reception terminal RX2 through a capacity C2. At the transmission/reception select switch 56b, switching is performed based on a control signal input to the control terminal control 2 to establish electrical connection to the a-contact or b-contact.

A filter 60a and a low noise amplifier (LNA) 61a are sequentially connected between the reception terminal RX1 and high frequency signal processing IC 50. A filter 60b and a low noise amplifier (LNA) 61b are sequentially connected between the reception terminal RX2 and high frequency signal processing IC 50.

Such a wireless communication apparatus is capable of GSM communication and DCS communication.

The first embodiment has the following advantages.

(1) Since the first amplifying stage (transistors Q1 and Q4) for the GSM amplifying system e and DCS amplifying system f are monolithically formed on the single semiconductor chip 25, a smaller size can be achieved compared to a structure in which they are incorporated in separate semiconductor chips. Since a part of bias resistors that constitute bias circuits for the first and second amplifying stages are monolithically formed on the semiconductor chip 25, the high frequency power amplifier can be made compact compared to a structure in which the chip resistors are separately mounted.

(2) The size and manufacturing cost of the high frequency power amplifier can be reduced through a reduction in the number of components that is achieved by monolithically forming the first amplifying stages and second amplifying stages of the GSM amplifying system e and the DCS amplifying system f on the single semiconductor chip 25 and by monolithically forming a part of the bias resistors that constitute the bias circuits for the first amplifying stage and second amplifying stage on the semiconductor chip 25 as described in the above (1).

(3) Referring to the terminals of the first amplifying stage and second amplifying stage provided on a surface of the semiconductor chip 25, the control terminals (e.g., gate electrodes) and first terminals (e.g., drain electrodes) are alternately provided in the same direction. Therefore, the direction of extracting the output of the first amplifying stage (the extending direction of the wire) and the direction of extracting the output of the second amplifying stage (the extending direction of the wire) are not close and adjacent to each other, which makes it possible to prevent any reduction in the gain and isolation attributable to a mutual induction effect between the wires 41.

(4) Since the input wire 41 connected to the control terminal of the second amplifying stage provided on the surface of the semiconductor chip 25 and the output wire 41 connected to the first terminal of the second amplifying stage extend in directions orthogonal to each other or in directions crossing each other, it is possible to suppress crosstalk between them.

(5) A Predetermined bias resistance ratio can be achieved by setting a bonding program for the threshold voltage Vth of each transistor and by connecting predetermined bias resistors with the electrical connectors (bonding wires) 40 based on the set program (there is an alternative of providing no connection with the electrical connectors). The resistance of a bias resistor constituted by a conductive layer formed on a semiconductor chip 25 can be defined with accuracy of 5% or less. It is therefore possible to set an optimum bias potential for each transistor to stabilize the operating point of the transistor. As a result, variations of a power control curve (Vapc-Pout) can be reduced to provide improved characteristics.

(6) A wireless communication apparatus incorporating a high frequency power amplifier having the advantages described in the above (1) through (5) is capable of high performance dual band communication and can be provided at a low cost with a compact size.

While the first embodiment has referred to an example in which MOS (metal oxide conductor) FETs are used as semiconductor amplifying elements that constitute amplifying stages, other transistors may be used. For example, the transistors may be silicon bipolar transistors, GaAs-MES (metal semiconductor) FETs, HBTs (hetero-junction bipolar transistors), HEMTs (high electron mobility transistors), Si—GeFETs or the like. The use of transistors with high performance will be advantageous especially in the final amplifying stage that serves as an output stage. HBTs and Si—GeFETs will now be briefly described.

Figure 16:
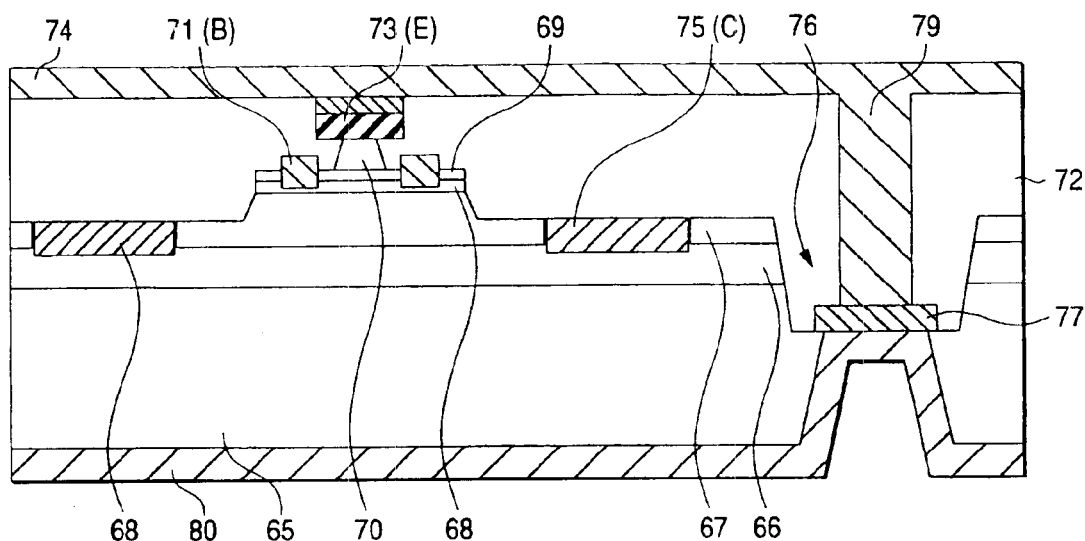
FIG. 16 is a sectional view of an HBT incorporated in the high frequency power amplifier of the first embodiment.
Figure 17:
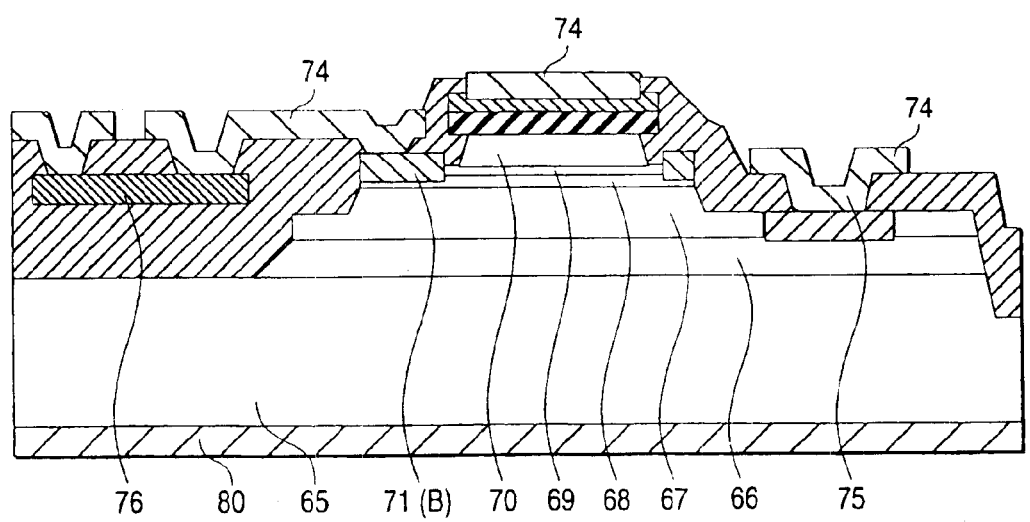
FIG. 17 is a sectional view of the HBT incorporated in the high frequency power amplifier of the first embodiment taken on another plane of the same.

Each of FIG. 16 and FIG. 17 is a sectional view of an HBT. An n+-type GaAs sub-collector layer 66 is provided on a semi-insulating GaAs substrate 65, and an n-type GaAs collector layer 67 is provided on the n+-type GaAs sub-collector layer 66. The n-type GaAs sub-collector layer 67 is selectively etched halfway to form a mesa portion that protrudes in a part of the same layer. In a region which is off the mesa portion and in which the thin n-type GaAs sub-collector layer 67 is formed, the n-type GaAs sub-collector layer 67 is partially etched, and a collector electrode 75 is provided in the etched region.

A p+-type GaAs base layer 68, an n-type InGaP emitter layer 69, and an n+-type GaAs cap layer 70 are sequentially formed on the mesa portion in an overlapping relationship. While the p+-type GaAs base layer 68 and n-type InGaP emitter layer 69 are in substantially the same size and are overlapped in alignment with each other, the n+-type GaAs cap layer 70 is formed in the middle of the mesa portion in a narrow rectangular configuration.

The n-type InGaP emitter layer 69 and n+-type GaAs cap layer 70 are selectively etched in a mesa region out of the n+-type GaAs cap layer 70 to provide a contact hole, and a base electrode 71 is provided in the contact hole.

The top surface of the semi-insulating GaAs substrate 65 is covered by an insulation film 72 for surface protection.

The insulation film 72 is partially etched to form contact holes that provide electrical contact of each electrode of the HBT. Before forming the above-described top insulation film, an emitter electrode 73 (two layers are shown in FIG. 16) is formed on the n+-type GaAs cap layer 70. Then, wiring metals 74 are formed after forming contact holes, and the wiring metals 74 are connected to the emitter electrode 73, base electrode 71, and collector electrode 75.

During the fabrication of the HBT, etching is performed to form an isolation groove 76 in the n-type GaAs collector layer 67 and n+-type GaAs sub-collector layer 66. The isolation groove 76 reaches the top of the semi-insulating GaAs substrate 65. A metal layer 77 is provided on the bottom of the isolation groove 76 as an etching stopper. A contact hole 78 is provided on the bottom surface of the semi-insulating substrate 65. The hole 78 is formed such that its bottom is defined by the metal layer 77. The wiring metals 74 are electrically connected to the metal layer 77 through conduction wiring 79 filled in holes provided in the insulation film 72. An electrode 80 is also provided on the bottom surface of the semi-insulating GaAs substrate 65, and the electrode 80 is connected to the emitter electrode 73 through the metal layer 77 and conduction wiring 79. Reference numeral 81 in the figure represents a resistor.

Figure 18:
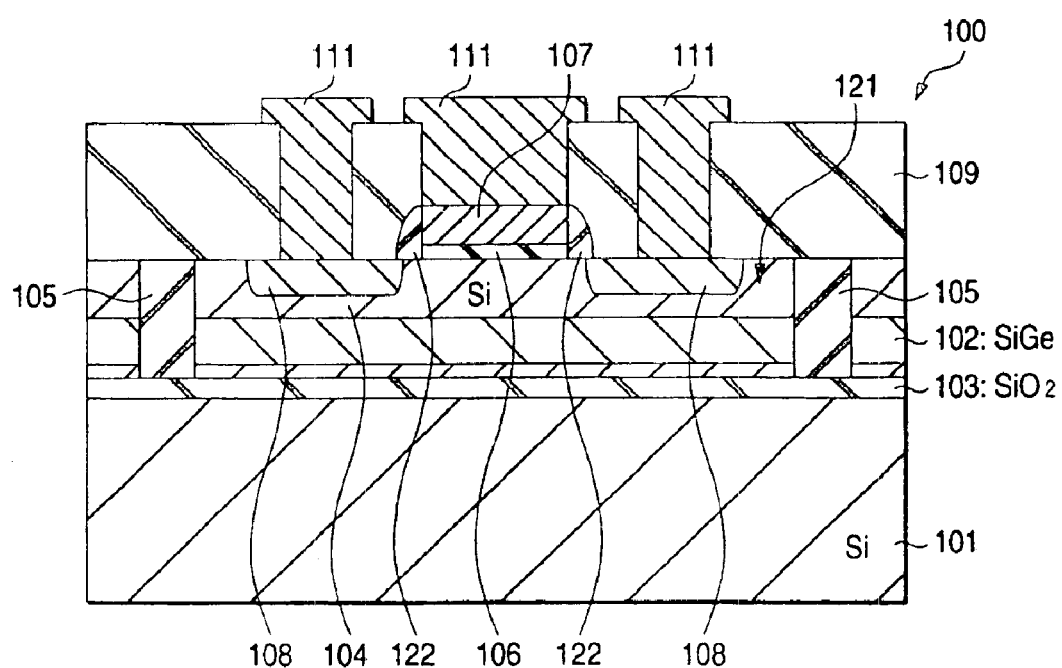
FIG. 18 is a sectional view of a Si—GeFET. incorporated in the high frequency power amplifier of the first embodiment.

FIG. 18 is a schematic sectional view of a Si—GeFET. As shown in FIG. 1, a Si—GeFET 100 has a structure in which a SiGe distortion imparting layer 102 made of $Si_{1-x}Ge_x(0 \leq x \leq 1)$ and a distorted Si channel layer 104 are sequentially formed and grown on a top surface (principal surface) of a Si substrate 101. It also has a structure in which a $SiO_2$ insulation layer 103 is provided in the Si substrate 101 near the surface thereof.

In the Si layer above the distorted Si channel layer 104, SiGe distortion imparting layer 102, and $SiO_2$ insulation layer 103, a device separating insulation region 105 is formed which penetrates to reach the $SiO_2$ insulation layer 103 at the bottom thereof. A pair of diffusion regions 108 to serve as a source region and drain region of a field effect transistor are provided in a device forming region 121 surrounded by the device separating insulation region 105.

A gate oxide film 106 is provided on the surface of the distorted Si channel layer 104 between the pair of diffusion regions 108. A gate electrode 107 is provided on the gate oxide film 106, and sidewalls 122 constituted by an insulator are provided on both ends of the gate oxide film 106 and gate electrode 107. The diffusion region 108 is provided on both sides of the gate oxide film 106.

A layer insulation film 109 is provided on the distorted Si channel layer 104, gate electrode 107, and sidewalls 122. Contact holes are provided in the layer insulation film 109, and metal wiring 111 is formed in the contact holes to form gate wiring connected to the gate electrode 107 and source and drain wiring connected to the diffusion region 108, thereby providing a field effect transistor.

[Second Embodiment]

Figure 19:
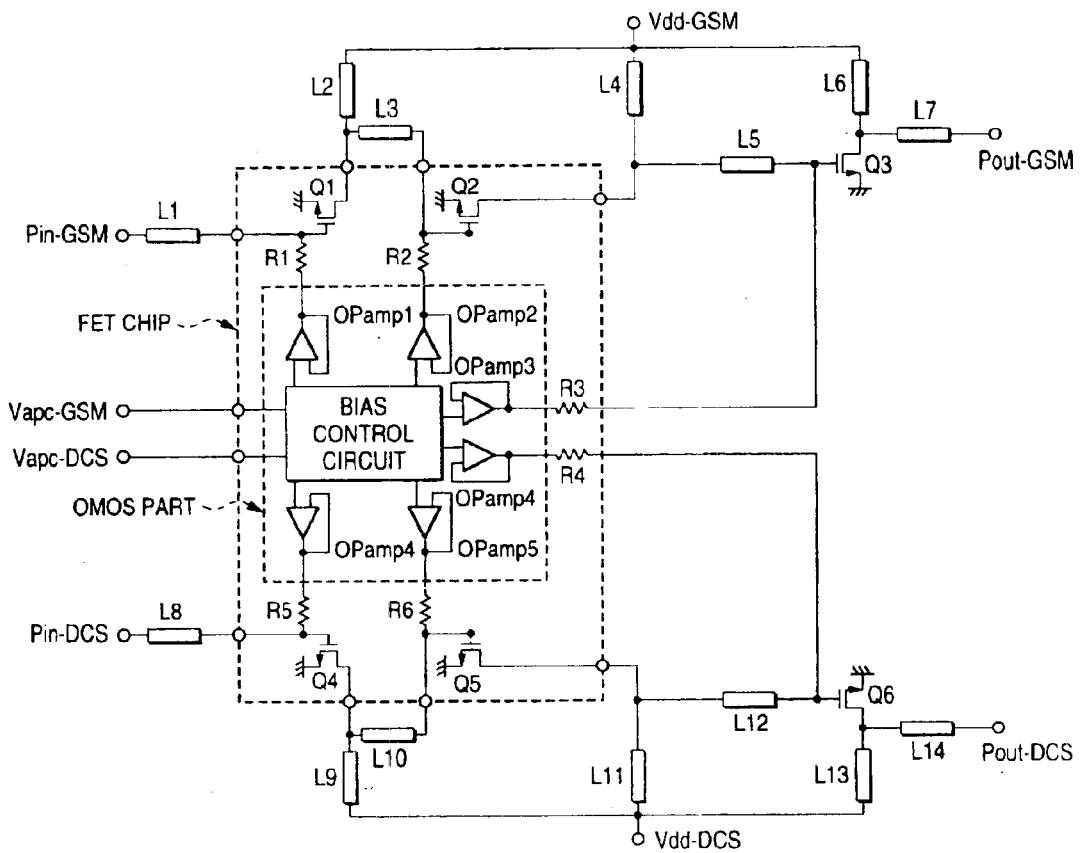
FIG. 19 is an equivalent circuit diagram of a high frequency power amplifier which is another embodiment of the invention (second embodiment).

FIG. 19 is a circuit diagram of a high frequency power amplifier which is another embodiment (second embodiment) of the invention. In the present embodiment, the above-described first embodiment is modified such that a bias control circuit 85 is incorporated in the semiconductor chip 25 and such that output signals from the bias control circuit 85 are respectively output to operational amplifiers Opamp 1 through Opamp 6 to control the bias resistance of the transistors Q1 through Q6.

Figure 20:
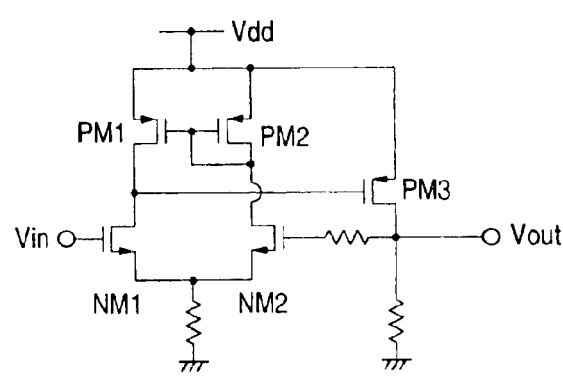
FIG. 20 is a circuit diagram illustrating control of bias resistance utilizing an operational amplifier in the second embodiment.

FIG. 20 is a circuit diagram for explaining the control of bias resistance performed by the operational amplifiers.

The bias control circuit 85 outputs bias control signals for the transistors to the operational amplifiers in accordance with a signal input from the APC. The operational amplifiers are configured to serve as voltage followers. As shown in the example of configuration in FIG. 20, the operational amplifier comprises a differential amplifier constituted by a pair of nMOS transistors NM1 and NM2, a current mirror (also referred to as "active load circuit") constituted by a pair of pMOS transistors PM1 and PM2, and a source follower constituted by a PMOS transistor PM3, an input voltage Vin and an output voltage Vout of the operational amplifier being the same voltage.

Figure 21:
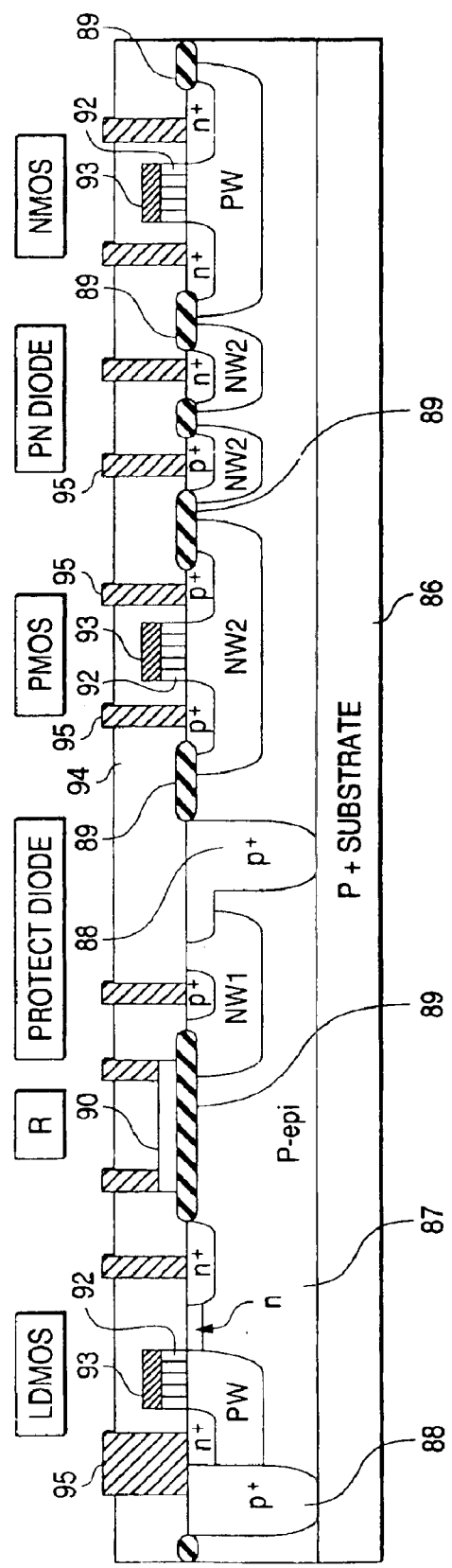
FIG. 21 is a schematic sectional view of semiconductor chips incorporated in the high frequency power amplifier of the second embodiment.

FIG. 21 is a schematic sectional view of the semiconductor chip 25. As shown in FIG. 21, p-type epitaxial layers 87 are formed on one surface of a $p^+$-type silicon substrate 86. Each of the epitaxial layers 87 is surrounded by a $p^+$-type isolation region 88. Well regions and impurity regions are formed in the expitaxial layer 87 electrically isolated by the isolation region 88; gate insulation films and gate electrodes are formed in predetermined positions; and a CMOS (complementary metal oxide semiconductor) constituted by a PMOS and NMOS, an LD (lateral doublediffused) MOS, a resistor R, a protective diode, and a PN diode are formed.

Figure 22:
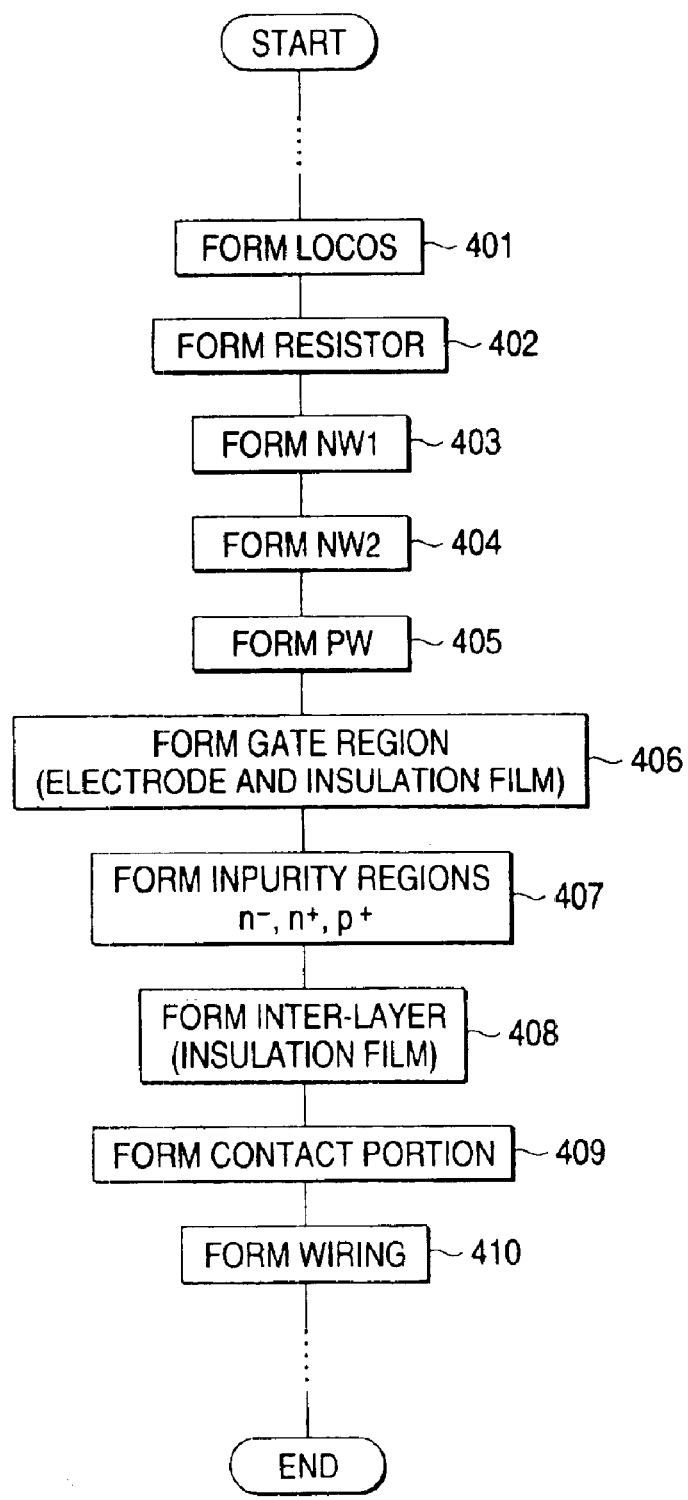
FIG. 22 is a flow chart showing a part of processes of the fabrication of a semiconductor chip incorporated in the high frequency power amplifier of the second embodiment.
Figure 23:
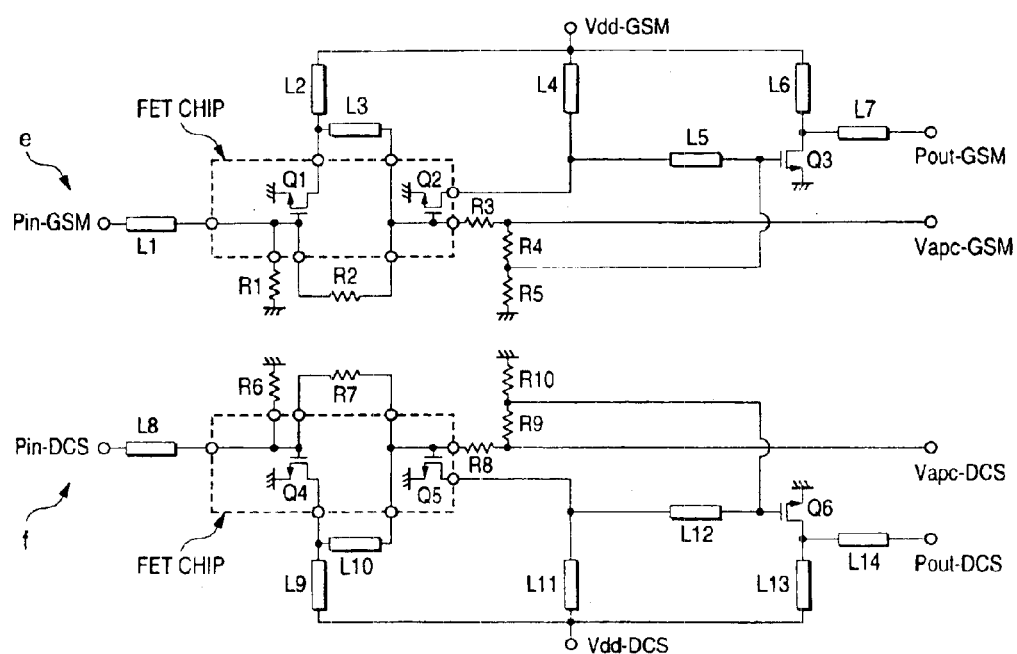

A description will be made on such a semiconductor device with reference to the flow chart in FIG. 22. The flow charts shows steps from the formation of LOCOS up to the formation of wiring.

After providing the $p^+$-type silicon substrate 86 having the epitaxial layer 87 on one surface thereof, a LOCOS (Local Oxidation of Silicon) film 89 is formed on the epitaxial layer 87 (S401).

A resistive layer 90 is then formed in a part of the LOCOS film 89 (S402). Next, a predetermined impurity is implanted in the epitaxial layer 87 to form the isolation region 88 and well regions. Specifically, an n-type well NW1 is formed in the location where the protective diode is to be formed; n-type wells NW2 are formed in the locations where the PMOS and PN diode are to be formed; and p-type wells PW are formed in the locations where the NMOS and LDMOS are to be formed (S403 through S405).

Gate regions are then formed (S406). Specifically, gate insulation films 92 constituted by thermal oxidation films are formed in the locations where the LDMOS, PMOS, and NMOS are to be formed, and gate electrodes 93 made of polysilicon are formed on the gate insulation films 92 in an aligned and overlapping relationship.

Next, a normal photolithographic technique and impurity diffusing technique are used to sequentially and selectively diffuse an impurity to form $p^+$ regions, $n^+$ regions, and $n^-$ regions, thereby forming semiconductor regions to serve as FETs and semiconductor regions to serve as diodes.

Next, a layer insulation film 94 is formed on the entire surface (S408). Thereafter, contact holes are formed in the layer insulation film 94 (S409). The contact holes are formed such that they extend toward predetermined $p^+$ regions and $n^+$ regions, and the $p^+$ regions and $n^+$ regions are exposed at the bottom of the contact holes.

Next, wires 95 are formed. The wires 95 are indicated by dots. The wires 95 are filled in the contact holes to be connected to the respective $p^+$ regions and $n^+$ regions. Thereafter, for example, planarization is carried out; an insulation film and wires are further formed; and a final passivation film is finally formed. While the $p^+$-type silicon substrate 86 has been described with reference to an illustration that shows only a region where a single semiconductor chip is formed, a semiconductor substrate having a large diameter is used in practice and is finally cut in longitudinal and lateral directions into individual semiconductor chips, thereby forming a multiplicity of semiconductor chips.

LDMOSs, resistors R, protective diodes, PMOSs, PN diodes, and NMOSs are thus formed. The PMOSs and NMOSs form CMOSs of the operational amplifiers, and LDMOSs form the transistors Q1 through Q6.

The high frequency power amplifier of the present embodiment is advantageous in that it has a reduced surface area and improved power efficiency compared in addition to the advantages provided by the high frequency power amplifier of the first embodiment.

While the invention conceived by the inventors has been specifically described with reference to preferred embodiments of the same, the invention is not limited to the above-described embodiments, and various modifications are obviously possible within the scope of the principle of the invention. Specifically, the embodiments have referred to a technique for connecting predetermined portions with an electrical connector as a feature for adjusting a bias resistance ratio, a method may alternatively employed in which a plurality of wiring sections are selectively cut through laser trimming to adjust a bias resistance ratio. Further, while the embodiments have referred to dual band systems, the invention may be similarly applied to multi-mode communication systems and multi-band and multi-mode communication systems with similar advantages.

Advantages provided in primary aspects of the invention disclosed in the present specification can be summarized as follows.

(1) A reduction in the number of components can be achieved by monolithically forming first and second amplifying stages of each amplifying system on a single semiconductor chip and by monolithically forming a part of bias resistors that constitute bias circuits for the first and second amplifying stages on the semiconductor chip.

(2) The size and manufacturing cost of a high frequency power amplifier can be achieved through a reduction in the number of components as described in the above (1).

(3) Any reduction in gain and isolation attributable to a mutual induction effect between wires can be prevented by providing terminals of the first and second amplifying stages on the surface of the semiconductor chip in specific locations.

(4) Since the input wire connected to the control terminal of the second amplifying stage provided on the surface of the semiconductor chip and the output wire connected to the first terminal of the second amplifying stage extend in directions orthogonal to each other or in directions crossing each other, it is possible to suppress crosstalk between them.

(5) A predetermined bias resistance ratio can be achieved by setting a bonding program for the threshold voltage Vth of each transistor and by connecting predetermined bias resistors with the electrical connectors (bonding wires) based on the set program (there is an alternative of providing no connection with the electrical connectors). As a result, the resistance of a bias resistor constituted by a conductive layer formed on a semiconductor chip can be defined with accuracy of 5% or less. It is therefore possible to set an optimum bias potential for each transistor to stabilize the operating point of the transistor and to provide improved characteristics.

(6) A wireless communication apparatus incorporating a high frequency power amplifier having the advantages described in the above (1) through (5) is capable of high performance dual band communication and can be provided at a low cost with a compact size.

What is claimed is:

1. A high frequency power amplifier module, comprising: a high frequency power amplifier and a bias control circuit, which are monolithically formed on a single semiconductor chip which is mounted on a module and which includes a first input terminal, a second input terminal, a first output terminal, and a second output terminal, wherein said high frequency power amplifier includes:

a first amplifying system coupled to the first input terminal and to the first output terminal, and including a plurality of first bias terminals, and a plurality of amplifying stage, which are sequentially cascaded between said first input terminal and said first output terminal and each of which is coupled to a corresponding one of the plurality of first bias terminal a so as to receive a bias potential therefrom, wherein each of said amplifying stages includes a MOSFET having a first conductivity type and a gate coupled to the corresponding first bias terminal, and a second amplifying system coupled to the second input terminal and to the second output terminal, and including a plurality of second bias terminals, and a plurality of amplifying stages which are sequentially cascaded between said second input terminal and said second output terminal and each of which is coupled to a corresponding one of the plurality of second bias terminals so as to receive a bias potential therefrom, wherein each of said amplifying stages includes a MOSFET having the first conductivity type and a gate coupled to the corresponding second bias terminal, wherein said bias control circuit includes a first MOSFET of the first conductivity type and a second MOSFET of a second conductivity type different from the first conductivity type and is coupled to the plurality of first bias terminals and to the plurality of second bias terminals.

2. A high frequency power amplifier module according to claim 1, wherein said high frequency power amplifier module has a first control terminal arid a second control terminal, each of which are coupled to said bias control circuit, wherein said bias control circuit is arranged to receive a first control signal from said first control terminal, and to provide a bias voltage in accordance with the first control signal to said first amplifying system, and wherein said bias control circuit is arranged to receive a second control signal from second control terminal, and to provide a bias voltage in accordance with the second control, signal to said second amplifying system.

3. A high frequency power amplifier module according to claim 2, wherein the second MOSFET of the second conductivity type is coupled with the first MOSFET of the first conductivity type in series, the second MOSFET is coupled with a third MOSFET of the second conductivity type in parallel with their respective gate terminals connected to each other, and the gate terminal and drain terminal of the third MOSFET are connected to each other.

4. A high frequency power amplifier module according to claim 2, further comprising third and fourth amplifying systems mounted on the module and located at an outside of said semiconductor chip, said third and fourth amplifying systems being connected to the first output terminal and the second output terminal of said high frequency power amplifier, respectively.

5. A high frequency power amplifier module according to claim 4, wherein said bias potential output of said bias control circuit is supplied to the third and the fourth amplifying systems.

6. A high frequency power amplifier module according to claim 5, wherein the second MOSFET of the second conductivity type is coupled with the first MOSFET of the first conductivity type in series, the second MOSFET is coupled with a third MOSFET of the second conductivity type in parallel with their gate terminals connected to each other, and the gate terminal and drain terminal of the third MOSFET are connected to each other.

7. A wireless communication apparatus comprising high frequency power amplifier module according to claim 1.

8. A high frequency power amplifier integrated circuit device comprising:

a first input terminal;

first output terminal;

a second input terminal;

a second output terminal;

a first amplifying system coupled to the first input terminal and to the first output terminal, including amplifying elements having control terminals, and which are sequentially cascaded between said first input terminal and said first output terminal;

a second amplifying system coupled to the first input terminal and to the first output terminal, including amplifying elements having control terminals and which are sequentially cascaded between said second input terminal and said second output terminal;

a bias control circuit coupled to each of the control terminals of the plurality of first and second amplifying systems;

wherein the first amplifying system, the second amplifying system, and the bias control circuit are monolithically formed on a single semiconductor chip.

9. A high frequency power amplifier module according to claim 1, wherein each of said cascaded amplifying stages in said first amplifying system and said second amplifying system includes a control terminal and an output terminal, wherein said control terminals and said output terminals in each respective stage are alternatively provided in the same direction.

10. A high frequency power amplifier module according to claim 9, wherein a bias resistance ratio of the first amplifying stage of each of said first and second amplifying systems or bias resistance ratios of the first amplifying stage and second amplifying stage of each of maid first and second amplifying systems can be adjusted.

11. A high frequency power amplifier module according to claim 10, wherein the bias resistance ratio of the first amplifying stage of each of said first and second amplifying systems or the bias resistance ratios of the first amplifying stage and second amplifying stage of each of said first and second amplifying systems are adjusted by selecting connecting positions of electrical connectors that connect bias resistors formed on the surface of said semiconductor chip, the selection including a choice of no connection with the electrical connectors.

12. A high frequency power amplifier integrated circuit device according to claim 8, further comprising:

a plurality of bonding pads formed on the single semiconductor chip;

wherein the bias control circuit is coupled to said plurality of bonding pads, and includes a plurality of resistors, said bias control circuit being adapted to apply to one of said first amplifying MOSFETs, a bias potential value which is determined by a combination of resistors in the plurality of resistors, wherein the combination of resistors is determined by an electrical connection between bonding pads in the plurality of bonding pads.

13. A high frequency power amplifier integrated circuit device according to claim 12, wherein the bias resistance ratio of a first one of said first amplifying MOSFETs or the bias resistance ratios of said first one of said first amplifying MOSFETs and a second one of said first amplifying MOSFETs are adjusted by selecting connecting positions of electrical connectors that connect the plurality of bias resistors formed on the surface of said semiconductor chip, the choice including no connection with the electrical connectors.

14. A wireless communication apparatus comprising a high frequency power amplifier integrated circuit device according to claim 8.

* * * * *